United States Patent
Fu et al.

(10) Patent No.: US 6,777,349 B2
(45) Date of Patent: Aug. 17, 2004

(54) HERMETIC SILICON CARBIDE

(75) Inventors: Haiying Fu, West Linn, OR (US); Ka Shun Wong, San Jose, CA (US); Xingyuan Tang, West Linn, OR (US); Judy Hsiu-Chih Huang, Los Gatos, CA (US); Bart Jan van Schravendijk, Sunnyvale, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 10/184,681

(22) Filed: Jun. 28, 2002

(65) Prior Publication Data
US 2003/0176080 A1 Sep. 18, 2003

Related U.S. Application Data

(63) Continuation-in-part of application No. 10/099,232, filed on Mar. 13, 2002, now Pat. No. 6,764,952.

(51) Int. Cl.[7] ............................................. H01L 21/31
(52) U.S. Cl. ...................... 438/778; 438/780; 438/788; 438/789; 438/793; 438/931
(58) Field of Search ................................ 438/778, 780, 438/786, 789, 793, 931, 787–794, 769–770, 775

(56) References Cited

U.S. PATENT DOCUMENTS

| | | |
|---|---|---|
| 5,011,706 A | 4/1991 | Tarhay et al. |
| 5,380,567 A | 1/1995 | Haluska |
| 5,481,135 A | 1/1996 | Chandra et al. |
| 5,711,987 A | 1/1998 | Bearinger et al. |
| 5,753,374 A | 5/1998 | Camilletti et al. |
| 5,776,235 A | 7/1998 | Camilletti et al. |
| 5,818,071 A | 10/1998 | Loboda et al. |
| 5,825,078 A | 10/1998 | Michael |
| 6,072,227 A | 6/2000 | Yau et al. |
| 6,100,587 A | 8/2000 | Merchant et al. |
| 6,287,990 B1 | 9/2001 | Cheung et al. |
| 6,365,506 B1 | 4/2002 | Chang et al. |
| 6,368,899 B1 | 4/2002 | Featherby et al. |
| 6,472,333 B2 * | 10/2002 | Xia et al. .................... 438/758 |
| 6,537,733 B2 * | 3/2003 | Campana et al. ............ 438/700 |
| 2003/0008528 A1 * | 1/2003 | Xia et al. .................... 438/787 |

* cited by examiner

Primary Examiner—Lynne Gurley
(74) Attorney, Agent, or Firm—Thomas Swenson

(57) ABSTRACT

Hermetic amorphous doped silicon carbide is deposited on an integrated circuit substrate in a PECVD reactor. Nitrogen-doping of an SiC film is conducted by flowing nitrogen-containing molecules, preferably nitrogen or ammonia gas, into the reactor chamber together with an organosilane, preferably tetramethylsilane, and forming a plasma. Oxygen-doping is conducted by flowing oxygen-containing molecules into the reaction chamber.

52 Claims, 2 Drawing Sheets

HERMETIC SILICON CARBIDE

RELATED APPLICATIONS

This application is a continuation-in-part application of commonly-owned and copending U.S. patent application Ser. No. 10/099,232, filed Mar. 13, 2002.

FIELD OF THE INVENTION

The invention is related to the field of hermetic barrier layers in integrated circuits, in particular, silicon carbide barrier layers.

BACKGROUND OF THE INVENTION
Statement of the Problem

There is a need in integrated circuits for hermetic barrier layers having low dielectric constants. When silicon carbide, SiC, is used as a barrier to protect underlying films in integrated circuit devices, moisture penetration through the silicon carbide needs to be minimized. SiC films prepared by conventional PECVD methods show an abundance of Si—H and Si—$(CH_3)_x$ in the films, leading to moisture permeability of the SiC films. The problem is attributable mainly to the low film density caused by bulky —$(CH_3)$ groups, which generate large free volume inside the films and lead to ambient moisture penetration. Attempts in the prior art to increase hermeticity of barrier films often result in films having high dielectric constants, for example, of about 6.

SUMMARY OF THE INVENTION

The invention helps to solve some of the problems mentioned above by providing methods for fabricating a silicon carbide layer on an integrated circuit having good moisture-barrier properties and a low dielectric constant. A silicon carbide layer fabricated in accordance with the invention typically has a dielectric constant in a range of about from 4 to 5.

In one basic embodiment, the invention provides a plasma-enhanced method for depositing nitrogen-doped silicon carbide on an integrated circuit substrate. In one aspect, a method comprises flowing gaseous organosilane molecules into a reaction chamber. In another aspect, gaseous nitrogen-containing doping molecules are flowed into the reaction chamber. In another aspect, a gas plasma is formed in the reaction chamber. Preferably, the organosilane molecules comprise molecules having no Si—H bonds. Most preferably, the organosilane molecules comprise tetramethyl silane.

In another aspect, the doping molecules are selected from the group consisting of nitrogen gas, $N_2$, and ammonia gas, $NH_3$. Preferably, the flowrate of doping molecules into the reaction chamber is more than four times greater than the organosilane flowrate. In another aspect, a method in accordance with the invention comprises applying a low-frequency radio-frequency ("rf") bias to the substrate. In still another aspect, the applied bias has a frequency in a range of about from 100 kHz to 600 kHz. In another aspect, a method comprises a step of the applying a low-frequency rf bias to the substrate at a power in a range of about from 200 to 2000 Watts. Preferably, the low-frequency rf bias has a frequency of about 250 kHz and is applied in a range of about from 300 to 600 Watts.

In another aspect, forming a gas plasma comprises applying high-frequency radio frequency power to the reaction chamber. In still another aspect, applying high-frequency power comprises applying power having a frequency in a range of about from 10 MHz to 30 MHz, preferably about 13.6 MHz. In another aspect, applying high-frequency rf power comprises applying power in a range of about from 200 to 4000 watts. Preferably, power is applied in a range of about from 300 to 1400 watts to form a plasma.

In another aspect, a method in accordance with the invention comprises a step of maintaining the reaction chamber at a pressure in a range of about from 0.8 to 10 Torr. Preferably, the reaction chamber is maintained at a pressure in a range of about from 3 to 5 Torr. In another aspect, a method in accordance with the invention comprises a step of maintaining the reaction chamber at a temperature in a range of about from 200° to 600° C. Preferably, the reaction chamber is maintained at a temperature in a range of about from 350° to 425° C.

Another basic embodiment of a method in accordance with the invention provides a plasma-enhanced method for depositing oxygen-doped silicon carbide on an integrated circuit substrate. In one aspect, a method comprises flowing gaseous organosilane molecules into a reaction chamber. In another aspect, gaseous oxygen-containing doping molecules are flowed into the reaction chamber. In still another aspect, a gas plasma is formed in the reaction chamber. In still another aspect, the organosilane molecules comprise molecules having no Si—H bonds. Preferably, the organosilane molecules comprise tetramethyl silane.

In another aspect, the doping molecules comprise a weak oxidizer. In another aspect, the doping molecules comprise carbon dioxide, $CO_2$. In another aspect, weak-oxidizer oxygen doping molecules are flowed into the reaction chamber at a doping flowrate more than four times greater than the organosilane flowrate.

In another aspect, a method comprises the step of applying a low-frequency rf bias to the substrate, preferably at a frequency in a range of about from 100 kHz to 600 kHz. In another aspect, a low-frequency rf bias is applied to the substrate at a power in a range of about from 200 to 2000 Watts. In another aspect, a low-frequency rf bias is applied to the substrate at a frequency of about 250 kHz in a range of about from 400 to 800 Watts.

In another aspect, applying high-frequency rf power comprises applying power in a range of about from 200 to 4000 watts, preferably in a range of about from 300 to 1400 watts. In still another aspect, the reaction chamber is maintained at a pressure in a range of about from 0.8 to 10 Torr, preferably at a pressure in a range of about from 1.5 to 3 Torr. In another aspect, the reaction chamber is maintained at a temperature in a range of about from 200° to 600° C., preferably in a range of about from 350° to 425° C.

In still another aspect, a method for depositing oxygen-doped silicon carbide comprises flowing oxygen doping molecules comprising a strong oxidizer, such as oxygen gas, ($O_2$) nitrous oxide ($N_2O$), and ozone ($O_3$). In still another aspect, the step of flowing doping molecules into the reaction chamber comprises flowing oxygen doping molecules at a doping flowrate about the same or less than the organosilane flowrate.

A third basic embodiment of a method in accordance with the invention provides a plasma-enhanced method for depositing doped silicon carbide containing both nitrogen dopant and oxygen dopant. In one aspect, gaseous organosilane molecules are flowed into a reaction chamber. In another aspect, gaseous nitrogen doping molecules and oxygen doping molecules are flowed into the reaction chamber. In another aspect, a gas plasma is formed in the reaction chamber.

In another aspect, the organosilane molecules comprise molecules having no Si—H bonds. Preferably, the organosilane molecules comprise tetramethyl silane. In another aspect, the nitrogen doping molecules are selected from the group consisting of nitrogen gas, $N_2$, and ammonia gas, $NH_3$, and the oxygen doping molecules comprise a weak oxidizer, for example, carbon dioxide, $CO_2$. In another aspect, the step of flowing the nitrogen doping molecules and weak-oxidizer oxygen doping molecules into the reaction chamber comprises flowing the doping molecules at a doping flowrate more than four times greater than the organosilane flowrate.

In another aspect, the nitrogen doping molecules are selected from the group consisting of nitrogen gas, $N_2$, and ammonia gas, $NH_3$, and the oxygen doping molecules comprise a strong oxidizer, for example, oxygen gas, $(O_2)$, nitrous oxide $(N_2O)$, and ozone $(O_3)$. In another aspect, the step of flowing the nitrogen doping molecules and strong-oxidizer oxygen doping molecules into the reaction chamber comprises flowing the nitrogen doping molecules at a nitrogen doping flowrate more than two times greater than the organosilane flowrate, and flowing the strong-oxidizer oxygen doping molecules at an oxygen doping flowrate about the same or less than the organosilane flowrate.

In another aspect, a low-frequency rf bias is applied to the substrate. In another aspect, the low-frequency rf bias is applied at a frequency in a range of about from 100 kHz to 600 kHz. In still another aspect, the low-frequency rf bias is applied at a power level in a range of about from 200 to 2000 Watts. In another aspect, the step of applying a low-frequency rf bias to the substrate comprises applying a bias at a frequency of about 250 kHz in a range of about from 300 to 600 Watts. In another aspect, forming a gas plasma comprises applying high-frequency rf power to the reaction chamber. In another aspect, applying high-frequency rf power comprises applying power having a frequency in a range of about from 10 MHz to 30 MHz, preferably about 13.6 MHz. In another aspect, applying high-frequency rf power comprises applying power in a range of about from 200 to 4000 watts. In another aspect, applying high-frequency rf power comprises applying power in a range of about from 300 to 1400 watts.

In another aspect, depositing a silicon carbide layer containing both nitrogen and oxygen dopant comprises maintaining the reaction chamber at a pressure in a range of about from 0.8 to 10 Torr, preferably in a range of about from 2 to 4 Torr. In another aspect, the reaction chamber is maintained at a temperature in a range of about from 200° to 600° C., preferably in a range of about from 350° to 425° C.

BRIEF DESCRIPTION OF THE DRAWINGS

A more complete understanding of the invention may be obtained by reference to the drawings, in which.

DESCRIPTION OF THE INVENTION

Figure 1:
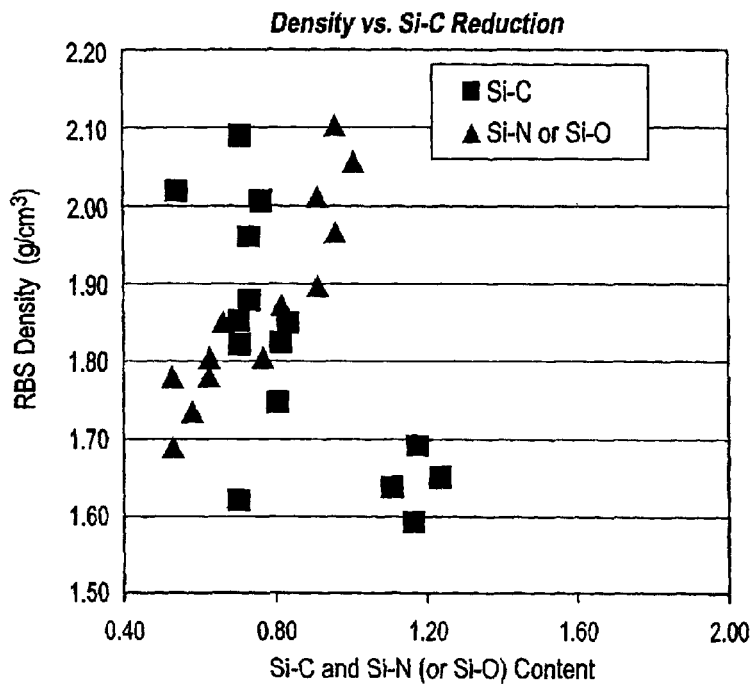
FIG. 1 includes a graph in which SiC-film density was plotted as a function of the measured content of Si—C bonds and Si—N (or Si—O) bonds in SiC films.

The invention is described herein with reference to exemplary nitrogen-doped and oxygen-doped silicon carbide films. It should be understood that the particular embodiments serve explanatory purposes and are not limiting descriptions of structures and methods in accordance with the invention. Furthermore, exemplary silicon carbide films discussed herein below were fabricated in accordance with the invention in a Novellus "Sequel" PECVD module, which accommodates six 200 mm wafers. The flow rates of gaseous streams presented and discussed in the application are total flow rates into a Novellus "Sequel" reactor. It is understood that silicon carbide deposition may also be conducted using an apparatus having a volume and wafer-capacity different from the module used in Example 1 without departing from the scope of the invention. Thus, the embodiments described herein are exemplary and are not intended to limit the scope of the invention, which is defined in the claims below.

An object of a method in accordance with the invention is fabrication of a hermetic amorphous silicon carbide layer having a low dielectric constant. A silicon carbide film in accordance with the invention is particularly useful as a barrier in an integrated circuit: for example, as a barrier layer in a copper damascene structure, as an etch stop, and as an intermetal dielectric layer. Film hermeticity and low moisture permeability are improved, compared to conventional barrier films. It is believed that improved hermeticity and reduced moisture permeability are achieved through increased film density. A doping of silicon carbide with nitrogen or oxygen or both reduces the relative numbers of Si—H, Si—$CH_x$ and similar bonds, which are related to open structures causing relatively low-density in conventional barrier films. Doping with nitrogen or oxygen or both in accordance with the invention leads to higher density and lower hydrogen content in the deposited silicon carbide films.

In accordance with the invention, organosilane molecules flow into a reaction chamber, preferably into a PECVD reaction chamber. Preferably, the relative number of Si—H bonds in the organosilane is minimized. For this reason, the organosilane molecules preferably comprise fully R-substituted silanes and other organosilanes. In the examples presented below, tetramethyl silane ("4MS)", $Si(CH_3)_4$, was used to deposit silicon carbide films in accordance with the invention.

Nitrogen-doping and oxygen-doping in accordance with the invention is conducted by flowing nitrogen-containing doping molecules or oxygen-containing doping molecules or both into the reaction chamber, in which a plasma is formed by applying energy to the resulting reaction mixture. Nitrogen doping molecules typically comprise nitrogen gas, $N_2$, or ammonia gas, $NH_3$, or both. Oxygen doping molecules typically comprise weak-oxidizer oxygen-containing molecules, such as $CO_2$. In another embodiment in accordance with the invention, strong-oxidizer molecules, such as gaseous oxygen $(O_2)$, nitrous oxide $(N_2O)$, and ozone $(O_3)$, are flowed into the reactor. Because the strong-oxidizer oxygen atoms present in the plasma are so reactive, it is necessary to limit the amount of strong-oxidizer molecules flowing into the reaction chamber to a relatively small amount, for example, about the same or less than the number of organosilane molecules. Otherwise, the number of oxygen atoms incorporated into the deposited layer will exceed dopant levels and adversely affect the barrier properties of the silicon carbide.

High-frequency radio-frequency ("hf-rf") power, typically in a range of about from 10 MHz to 30 MHz, preferably at 13.6 MHz, is used to form a plasma from the reactant gases in the reaction chamber. Preferably, low-frequency radio-frequency ("lf-rf") energy, typically at about 250 kHz, is applied to the substrate to create a bias. The low-frequency bias tends to increase hermeticity in a silicon carbide film in accordance with the invention.

A set of representative ranges of operating variables and conditions for depositing hermetic silicon carbide in accordance with the invention is presented here. The flow rates listed are valid for a Novellus "Sequel" PECVD module treating six integrated circuit wafer substrates to deposit doped silicon carbide. It is understood that the flow rates listed here would require modification for a different-sized reaction chamber.

| | |
|---|---|
| Tetramethylsilane flow: | 100–2000 sccm |
| $CO_2$ flow: | 0–8000 sccm |
| $N_2$ flow: | 0–5000 sccm |
| $NH_3$ flow: | 0–5000 sccm |
| $O_2$ flow: | 0–400 sccm |
| inert gas flow: | 0–3000 sccm (e.g., He) |
| hf-rf: | 200–4000 W |
| lf-rf: | 0–2000 W |
| Pressure: | 0.8–10 Torr |
| Temperature: | 200–600° C. |

As mentioned above, tetramethyl silane, 4MS, is preferred in a method in accordance with the invention. 4MS is particularly useful because it contains no active H-group, i.e., no S—H bond. An active H-group encourages cross-linking in silicon carbide. The absence of an active H-group reduces the amount of free hydrogen in a silicon carbide layer.

Pressure in a PECVD reaction chamber used in accordance with the invention is in a range of about from 0.8 to 10 Torr. When nitrogen doping, the preferred range is about from 3 to 5 Torr. When oxygen doping, the preferred range is about from 1.5 to 3 Torr. When doping with both nitrogen and oxygen, the preferred range is about from 2 to 4 Torr. Generally, the lower the pressure, the better is the hermeticity. A preferred temperature range is 300–450° C., and a most preferred range is about from 350 to 425° C.

A hermetic silicon carbide film fabricated in accordance with the present invention has a dielectric constant in a range of about 4.0–5.0. Useful thicknesses of silicon carbide coatings fabricated in accordance with the invention are in a range of about from 10 nm to 4 $\mu$m. Silicon carbide coatings used as intermetal dielectric layers and other types of barriers in integrated circuits typically have a thickness in a range of about from 50 to 80 nm. The deposition rate of silicon carbide in the method in accordance with the invention is typically in a range of about from 50 to 300 nm/min, and preferably in a range of about from 100 to 150 nm/min.

The deposition rate is controlled principally by varying the pressure and temperature of the reaction chamber and the power of the low-frequency rf bias applied to the substrate.

EXAMPLE 1

A series of doped silicon carbide films were fabricated under various conditions in accordance with the invention using a Novellus "Sequel" PECVD module, which holds six 200 mm wafers. In addition, silicon carbide films without nitrogen or oxygen doping were also produced under similar conditions but without flowing nitrogen doping or oxygen doping molecules into the reaction chamber. The hermeticity of the films was then determined. Hermeticity is a measure of the moisture-barrier capability of a deposited film. Hermeticity values are relative values and were determined using measurements from a tensile TEOS method, in particular, the Pressure Cook method. Each doped SiC film of approximately 70–75 nm thickness was deposited on top of a thick tensile TEOS film, the TEOS film typically having a thickness of 500 nm with stress of $2.4 \cdot 10^9$ dynes/cm$^2$. The SiC/TEOS stack was "cooked" in water vapor at 120° C. and 2 atm pressure for 10 hours. The stress drift of the film stack was then measured. The measured stress shift gives a quantitative measure of how hermetic the SiC film is. The less stress drift of a tensile SiC/TEOS stack that occurred, the more hermetic is the SiC film. The stress shift was then converted and linearized into a "hermeticity" scale, having a value from 0 to 10, with 0 indicating the worst hermeticity, and 10 indicating the best hermeticity. The stress shift of stacks containing a non-doped SiC film showed the most stress shift, corresponding to a hermeticity value of 0. On the other hand, an idealized zero-shift corresponded to a hermeticity value of 10. The actual calculated values of hermeticity of the SiC films doped in accordance with the invention were therefore between 0 and 10. A hermeticity value of 5 or higher may be considered good.

Table 1 below shows operating conditions used in fabricating doped silicon carbide films in accordance with the invention, as well as non-doped silicon carbide films. Pure gases were flowed into the reaction chamber at the flow rates indicated. The high-frequency was 13.56 MHz. The low-frequency value was 250 kHz. The operating temperature for all of the examples was about 400° C. Table 1 also includes calculated hermeticity values for each of the SiC films listed. It should be understood that Table 1 does not include all process combinations tested. It should be likewise understood that many different combinations of process operating conditions not shown in Table 1 may be utilized in accordance with the invention.

TABLE 1

| | 4MS (Sccm) | $CO_2$ (Sccm) | $N_2$ | $NH_3$ | Pressure (Torr) | HF (W) | LF (W) | Hermeticity (0-worst, 10-best) |
|---|---|---|---|---|---|---|---|---|
| SiC n1 | 500 | 2500 | 0 | 0 | 2 | 600 | 400 | 4 |
| SiC n2 | 500 | 2500 | 0 | 0 | 2 | 600 | 700 | 6 |
| SiC n3 | 500 | 2500 | 0 | 0 | 2 | 600 | 550 | 5 |
| SiC n4 | 500 | 2500 | 0 | 0 | 2 | 800 | 400 | 3 |
| SiC n5 | 500 | 2500 | 0 | 0 | 2 | 1100 | 550 | 5 |
| SiC e6 | 500 | 2500 | 0 | 0 | 1.8 | 600 | 300 | 3 |
| SiC n6 | 700 | 3500 | 0 | 0 | 2 | 600 | 550 | 5 |
| SiC n7 | 700 | 3500 | 0 | 0 | 2 | 600 | 400 | 4 |
| SiC n8 | 700 | 3500 | 0 | 0 | 2 | 600 | 700 | 6 |
| SiC n9 | 700 | 3500 | 0 | 0 | 2 | 800 | 400 | 4 |

TABLE 1-continued

|  | 4MS (Sccm) | CO$_2$ (Sccm) | N$_2$ | NH$_3$ | Pressure (Torr) | HF (W) | LF (W) | Hermeticity (0-worst, 10-best) |
|---|---|---|---|---|---|---|---|---|
| SiC n10 | 700 | 3500 | 0 | 0 | 2 | 1100 | 550 | 5 |
| SiC n11 | 700 | 3500 | 0 | 0 | 3 | 600 | 600 | 2 |
| SiC n12 | 700 | 3500 | 0 | 0 | 3 | 600 | 400 | 1 |
| SiC n13 | 700 | 3500 | 0 | 0 | 3 | 600 | 800 | 3 |
| SiC nd1 | 400 | 0 | 2000 | 750 | 4.5 | 950 | 400 | 5 |
| SiC nd2 | 400 | 0 | 2000 | 750 | 4.5 | 700 | 400 | 6 |
| SiC nd3 | 400 | 0 | 2000 | 750 | 4.5 | 450 | 400 | 6 |
| SiC nd4 | 400 | 0 | 2000 | 750 | 4.5 | 1200 | 400 | 6 |
| SiC ne1 | 400 | 0 | 1000 | 750 | 4 | 500 | 500 | 5 |
| SiC ne2 | 400 | 0 | 2000 | 750 | 4 | 1200 | 500 | 8 |
| SiC ne3 | 400 | 0 | 1000 | 750 | 4 | 1200 | 500 | 4 |
| SiC ne4 | 400 | 0 | 2000 | 400 | 4 | 500 | 500 | 8 |
| SiC ne5 | 400 | 0 | 2000 | 750 | 4 | 500 | 500 | 9 |
| SiC ne6 | 400 | 0 | 1000 | 400 | 4 | 1200 | 500 | 2 |
| SiC ne7 | 400 | 0 | 1000 | 400 | 4 | 500 | 500 | 2 |
| SiC ne8 | 400 | 0 | 2000 | 400 | 4 | 1200 | 500 | 7 |
| SiC ns1 | 350 | 0 | 0 | 4000 | 4 | 500 | 500 | 5 |
| SiC ns2 | 2000 | 0 | 0 | 0 | 2.3 | 500 | 500 | 0 |

A review of the results calculated in Table 1 indicates that numerous combinations of variables and operating conditions are useful to make hermetic silicon carbide in accordance with the invention.

In the graph of FIG. 1, SiC-film density was plotted as a function of the measured content of Si—C bonds and Si—N (or Si—O) bonds in representative SiC films. Film density was measured by a Rutherford Back Scattering ("RBS") technique. Film content was measured using a Fourier Transform Infrared ("FTIR") technique. The triangle-shaped data points show that film density increased as the concentration of Si—N (or Si—O) bonds increased. Conversely, the square-shaped data points show that film density decreased as the concentration of Si—C bonds increased.

Figure 2:
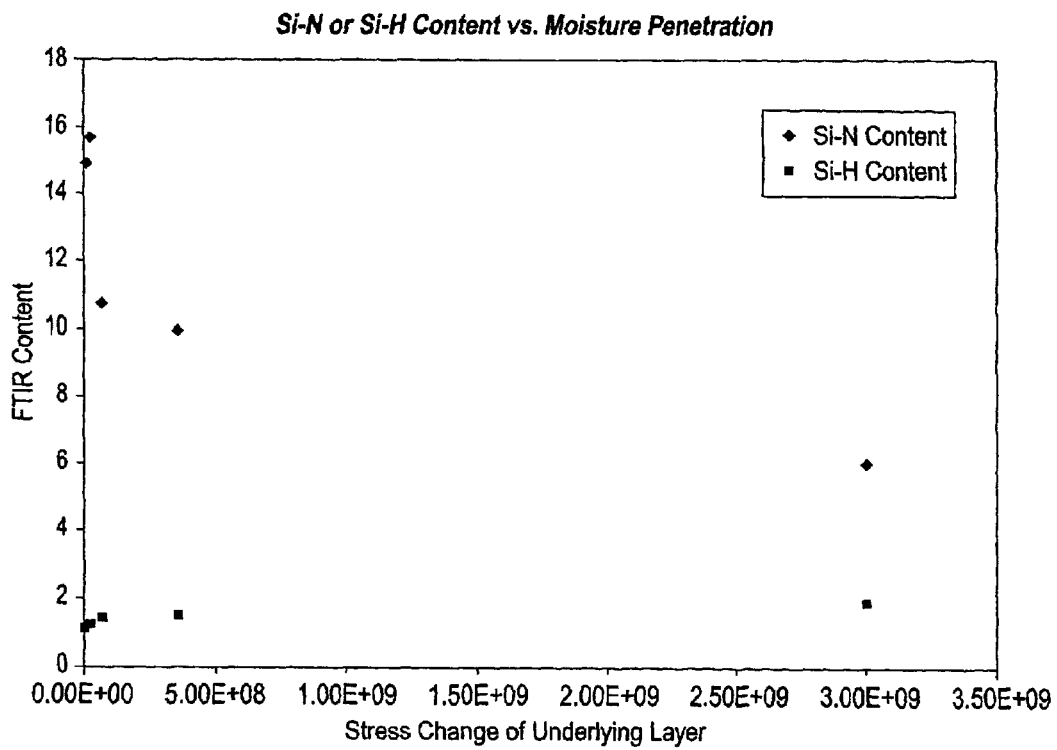
FIG. 2 includes a graph in which measured content of Si—C bonds and Si—N (or Si—O) bonds in five SiC films was plotted as a function of the stress change.

In the graph of FIG. 2, the measured content of Si—C bonds and Si—N (or Si—O) bonds in five representative SiC films was plotted as a function of the stress change. Film content was measured using FTIR. Stress change was measured using the tensile TEOS test. The diamond-shaped data points show that increased stress is related to decreased Si—N content.

Figure 3:
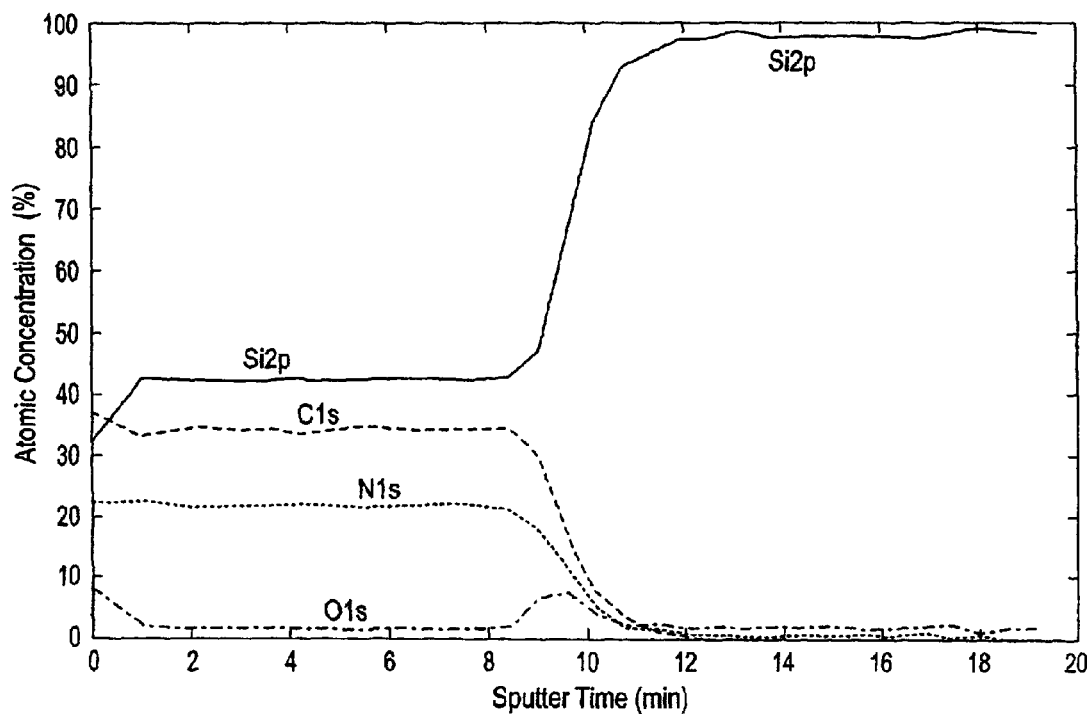
FIG. 3 shows a graph in which the atomic concentration of silicon, carbon, nitrogen and oxygen atoms in a selected nitrogen-doped SiC film is plotted as a function of sputter time.

In the graph of FIG. 3, the atomic concentration of silicon ("Si"), carbon ("C"), nitrogen ("N") and oxygen ("O") atoms in a selected nitrogen-doped SiC film is plotted as a function of sputter time during which the deposited film was sputtered away and the atomic concentration was measured using an XPS technique. The designations "1s" and "2p" are standard electron orbital designations. The examined film was deposited in accordance with the invention using the following operating conditions: 4MS, 350 sccm; N$_2$, 1350 sccm; NH$_3$, 550 sccm; hf-rf 500W; lf-rf 500 W; 4 Torr; 400° C. The plotted results show low permeation of oxygen into the deposited SiC film, indicating good hermeticity.

Methods and barrier films in accordance with the invention are useful in a wide variety of circumstances and applications to provide hermetic silicon carbide having a low dielectric constant. It is evident that those skilled in the art may now make numerous uses and modifications of the specific embodiments described, without departing from the inventive concepts. It is also evident that the steps recited may, in some instances, be performed in a different order; or equivalent structures and processes may be substituted for the structures and processes described. Since certain changes may be made in the above systems and methods without departing from the scope of the invention, it is intended that all subject matter contained in the above description be interpreted as illustrative and not in a limiting sense. Consequently, the invention is to be construed as embracing each and every novel feature and novel combination of features present in or inherently possessed by the methods and compositions described in the claims below and by their equivalents.

We claim:

1. A plasma-enhanced method for depositing nitrogen-doped hermetic silicon carbide on an integrated circuit substrate, comprising:

flowing gaseous organosilane molecules into a reaction chamber at an organosilane flowrate, the organosilane molecules having no Si—H bonds;

flowing gaseous nitrogen-containing doping molecules into the reaction chamber to make a gas mixture with the organosilane molecules, wherein the flowing of doping molecules into the reaction chamber comprises flowing doping molecules at a nitrogen dopant flowrate more than four times greater than the organosilane flowrate; and forming a gas plasma in the gas mixture in the reaction chamber at a pressure in a range of about from 3 Torr to 5 Torr.

2. A method as in claim 1, further characterized in that the organosilane molecules comprise tetramethyl silane.

3. A method as in claim 1, further characterized in that the doping molecules are selected from the group consisting of nitrogen gas, N$_2$ and ammonia gas, NH$_3$.

4. A method as in claim 1, further comprising applying a low-frequency rf bias to the substrate.

5. A method as in claim 4, further characterized in that the applying of a low-frequency rf bias to the substrate comprises applying a bias having a frequency in range of about from 100 kHz to 600 kHz.

6. A method as in claim 4, further characterized in that the applying of a low-frequency rf bias to the substrate comprises applying a bias at a power in a range of about from 0.1 Watts/cm$^2$ to 0.9 Watts/cm$^2$ of substrate surface area.

7. A method as in claim 6, further characterized in that the applying of a low-frequency rf bias to the substrate comprises applying a bias in a range of about from 0.15 Watts/cm$^2$ to 0.9 Watts/cm$^2$ of substrate surface area.

8. A method as in claim 1, further characterized in that the forming of a gas plasma comprises applying high-frequency rf power to the reaction chamber.

9. A method as in claim 8, further characterized in that the applying of high-frequency rf power comprises applying power having a frequency in a range of about from 10 MHz to 30 MHz.

10. A method as in claim 8, further characterized in that the applying of high-frequency rf power comprises applying power having a frequency of about 13.6 MHz.

11. A method as in claim 8, further characterized in that the applying of high-frequency rf power comprises applying power in a range of about from 0.1 Watts/cm$^2$ to 2.1 Watts/cm$^2$ of substrate surface area.

12. A method as in claim 11, further characterized in that the applying of high-frequency rf power comprises applying power in a range of about from 0.15 Watts/cm$^2$ to 0.75 Watts/cm$^2$ of substrate surface area.

13. A method as in claim 1, further comprising maintaining the reaction chamber at a temperature in a range of about from 200° C. to 600° C.

14. A method as in claim 1, further comprising maintaining the reaction chamber at a temperature in a range of about from 350° C. to 425° C.

15. A method as in claim 1, further characterized by not flowing strong-oxidizer molecules into the reaction chamber at a strong-oxidizer flow rate exceeding the organosilane flow rate, the strong-oxidizer molecules being included in the group consisting of $O_2$, $N_2O$, and $O_3$.

16. A plasma-enhanced method for depositing oxygen-doped hermetic silicon carbide on an integrated circuit substrate, comprising:
   flowing gaseous organosilane molecules into a reaction chamber at an organosilane flowrate, the organosilane molecules having no Si—H bonds;
   flowing gaseous oxygen-containing doping molecules into the reaction chamber to make a gas mixture with the organosilane molecules, characterized by flowing doping molecules at an oxygen dopant flowrate more than four times greater than the organosilane flowrate, and further characterized by not flowing strong-oxidizer molecules into the reaction chamber, the strong-oxidizer molecules being included in the group consisting of $O_2$, $N_2O$, and $O_3$; and
   forming a gas plasma in the gas mixture in the reaction chamber at a pressure in a range of about from 1.5 Torr to 3 Torr.

17. A method as in claim 16, further characterized in that the organosilane molecules comprise tetramethyl silane.

18. A method as in claim 16, further characterized in that the doping molecules comprise a weak oxidizer.

19. A method as in claim 18, further characterized in that the doping molecules comprise carbon dioxide, $CO_2$.

20. A method as in claim 16, further comprising applying a low-frequency rf bias to the substrate.

21. A method as in claim 20, further characterized in that the applying of a low-frequency rf bias to the substrate comprises applying a bias having a frequency in a range of about from 100 kHz to 600 kHz.

22. A method as in claim 20, further characterized in that the applying of a low-frequency rf bias to the substrate comprises applying a bias at a power in a range of about from 0.1 Watts/cm$^2$ to 0.9 Watts/cm$^2$ of substrate surface area.

23. A method as in claim 22, further characterized in that the applying of a low-frequency rf bias to the substrate comprises applying a bias in a range of about from 0.2 Watts/cm$^2$ to 0.4 Watts/cm$^2$ of substrate surface area.

24. A method as in claim 16, further characterized in that the forming of a gas plasma comprises applying high-frequency rf power to the reaction chamber.

25. A method as in claim 24, further characterized in that the applying of high-frequency rf power comprises applying power having a frequency in a range of about from 10 MHz to 30 MHz.

26. A method as in claim 24, further characterized in that the applying of high-frequency rf power comprises applying power having a frequency of about 13.6 MHz.

27. A method as in claim 24, further characterized in that the applying of high-frequency rf power comprises applying power in a range of about from 0.1 Watts/cm$^2$ to 2.1 Watts/cm$^2$ of substrate surface area.

28. A method as in claim 27, further characterized in that the applying of high-frequency rf power comprises applying power in a range of about from 0.15 Watts/cm$^2$ to 0.75 Watts/cm$^2$ of substrate surface area.

29. A method as in claim 16, further comprising maintaining the reaction chamber at a temperature in a range of about from 200° C. to 600° C.

30. A method as in claim 16, further comprising maintaining the reaction chamber at a temperature in a range of about from 350° C. to 425° C.

31. A plasma-enhanced method for depositing oxygen-doped hermetic silicon carbide on an integrated circuit substrate, comprising:
   flowing gaseous organosilane molecules into a reaction chamber at an organosilane flowrate, the organosilane molecules having no Si—H bonds;
   flowing gaseous strong-oxidizer molecules into the reaction chamber to make a gas mixture with the organosilane molecules at a strong-oxidizer flowrate not exceeding the organosilane flowrate; and
   forming a gas plasma in the gas mixture in the reaction chamber at a pressure in a range of about from 1.5 Torr to 3 Torr.

32. A method as in claim 31, further characterized in that the strong-oxidizer molecules are selected from the group consisting of $O_2$, $N_2O$, and $O_3$.

33. A plasma-enhanced method for depositing doped hermetic silicon carbide containing nitrogen dopant and oxygen dopant on an integrated circuit substrate, comprising:
   flowing gaseous organosilane molecules into a reaction chamber at an organosilane flowrate, the organosilane molecules having no Si—H bonds;
   flowing gaseous nitrogen doping molecules and oxygen doping molecules into the reaction chamber to make a gas mixture with the organosilane molecules, characterized by not flowing strong-oxidizer molecules at a strong-oxidizer flow rate exceeding the organosilane flow rate; and
   forming a gas plasma in the gas mixture in the reaction chamber at a pressure in a range of about from 2 Torr to 4 Torr.

34. A method as in claim 33, further characterized in that the organosilane molecules comprise tetramethyl silane.

35. A method as in claim 33, further characterized in that the nitrogen doping molecules are selected from the group consisting of nitrogen gas, $N_2$, and ammonia gas, $NH_3$.

36. A method as in claim 33, further characterized in that the oxygen doping molecules comprise weak-oxidizer molecules.

37. A method as in claim 36, further characterized in that the weak-oxidizer molecules comprise carbon dioxide, $CO_2$.

38. A method as in claim 36, further characterized in that the flowing of nitrogen doping molecules and oxygen doping molecules into the reaction chamber comprises flowing the doping molecules at a doping flowrate more than four times greater than the organosilane flowrate.

39. A method as in claim 33, further characterized in that the oxygen doping molecules comprise strong-oxidizer molecules.

40. A method as in claim 39, further characterized in that the strong-oxidizer molecules are selected from the group consisting of $O_2$, $N_2O$, and $O_3$.

41. A method as in claim 39, further characterized in that the flowing of doping molecules into the reaction chamber comprises flowing strong-oxidizer molecules at a strong-oxidizer flowrate not exceeding the organosilane flowrate.

42. A method as in claim 33, further comprising applying a low-frequency rf bias to the substrate.

43. A method as in claim 42, further characterized in that the applying of a low-frequency rf bias to the substrate comprises applying a bias having a frequency in a range of about from 100 kHz to 600 kHz.

44. A method as in claim 42, further characterized in that the applying of a low-frequency rf bias to the substrate comprises applying a bias at a power in a range of about from 0.1 Watts/$cm^2$ to 0.9 Watts/$cm^2$ of substrate surface area.

45. A method as in claim 44, further characterized in that the applying of a low-frequency rf bias to the substrate comprises applying a bias in a range of about from 0.15 Watts/$cm^2$ to 0.3 Watts/$cm^2$ of substrate surface area.

46. A method as in claim 33, further characterized in that the forming of a gas plasma comprises applying high-frequency rf power to the reaction chamber.

47. A method as in claim 46, further characterized in that the applying of high-frequency rf power comprises applying power having a frequency in a range of about from 10 MHz to 30 MHz.

48. A method as in claim 46, further characterized in that the applying of high-frequency rf power comprises applying power having a frequency of about 13.6 MHz.

49. A method as in claim 46 further characterized in that the applying of high-frequency rf power comprises applying power in a range of about from 0.1 Watts/$cm^2$ to 2.1 Watts/$cm^2$ of substrate surface area.

50. A method as in claim 49, further characterized in that the applying of high-frequency rf power comprises applying power in a range of about from 0.15 Watts/$cm^2$ to 0.75 Watts/$cm^2$ of substrate surface area.

51. A method as in claim 33, further comprising maintaining the reaction chamber at a temperature in a range from about 200° C. to 600° C.

52. A method as in claim 33, further comprising maintaining the reaction chamber at a temperature rf in a range from about 350° C. to 425° C.

* * * * *